United States Patent
Xu

(10) Patent No.: US 11,782,778 B2
(45) Date of Patent: Oct. 10, 2023

(54) DATA RECOVERY BYPASSING PROTOCOL FOR CLOUD NETWORK STORAGE SYSTEM

(71) Applicant: Alibaba Singapore Holding Private Limited, Singapore (SG)

(72) Inventor: Peng Xu, Milpitas, CA (US)

(73) Assignee: Alibaba Singapore Holding Private Limited, Singapore (SG)

( * ) Notice: Subject to any disclaimer, the term of this patent is extended or adjusted under 35 U.S.C. 154(b) by 22 days.

(21) Appl. No.: 17/387,986

(22) Filed: Jul. 28, 2021

(65) Prior Publication Data

US 2023/0033539 A1 Feb. 2, 2023

(51) Int. Cl.
| | |
|---|---|
| G06F 11/00 | (2006.01) |
| G06F 11/07 | (2006.01) |
| G06F 11/20 | (2006.01) |
| G11C 16/26 | (2006.01) |

(52) U.S. Cl.
CPC ...... *G06F 11/0727* (2013.01); *G06F 11/0772* (2013.01); *G06F 11/0793* (2013.01); *G06F 11/2094* (2013.01); *G06F 2201/82* (2013.01); *G11C 16/26* (2013.01)

(58) Field of Classification Search
CPC .............. G06F 3/0689; G06F 11/1084; G06F 11/1088; G06F 11/1092; G06F 11/16; G06F 11/1612; G06F 11/1666; G06F 11/2053; G06F 11/2094; G06F 11/0727; G06F 11/0772; G06F 11/0793
See application file for complete search history.

(56) References Cited

U.S. PATENT DOCUMENTS

| | | | |
|---|---|---|---|
| 8,949,182 | B2 | 2/2015 | Hildebrand et al. |
| 9,411,685 | B2 | 8/2016 | Lee |
| 9,483,367 | B1 | 11/2016 | Patil |
| 10,114,581 | B1 | 10/2018 | Natanzon et al. |
| 10,168,931 | B2 | 1/2019 | Joshi et al. |

(Continued)

FOREIGN PATENT DOCUMENTS

CN 109739777 A * 5/2019

OTHER PUBLICATIONS

Machine Translation of CN-109739777-A (Year: 2019).*

*Primary Examiner* — Michael Maskulinski
(74) *Attorney, Agent, or Firm* — Lee & Hayes, P.C.

(57) ABSTRACT

Methods and systems implement a data recovery bypassing protocol, by which a storage node of a cloud network may return a replica of lost data being recovered to timely service a read operation call from a computing node of the cloud network, without waiting for completion of a first, a second, and a third recovery function. Storage devices implement asynchronous event reporting ("AER") protocol between a storage engine and storage devices of the storage node. Within a storage device, an AER generation protocol enables a storage controller and a flash memory cell array of the storage device to intercommunicate, and enables the storage controller to generate AER messages. By bypassing secondary recovery, the computing node may successfully read lost data from many or all storage nodes of the cloud network, thus completing read operation calls without suffering milliseconds in performance loss and blocking, averting observable degradation of QoS of the overall computing system.

17 Claims, 10 Drawing Sheets

(56) References Cited

U.S. PATENT DOCUMENTS

| | | | |
|---|---|---|---|
| 10,503,611 B1 | 12/2019 | Srivastav et al. | |
| 10,713,122 B2 | 7/2020 | Sinha | |
| 10,776,208 B2 | 9/2020 | Harwood et al. | |
| 10,956,281 B2 | 3/2021 | Brown et al. | |
| 2015/0032938 A1* | 1/2015 | Salessi | H04L 9/008 |
| | | | 711/103 |
| 2015/0363419 A1 | 12/2015 | Chennamsetty et al. | |
| 2018/0226990 A1* | 8/2018 | Li | G11C 29/52 |
| 2021/0004298 A1 | 1/2021 | Kripalani et al. | |
| 2021/0089389 A1* | 3/2021 | Kaynak | H03M 13/152 |
| 2022/0269561 A1* | 8/2022 | Yoo | G06F 3/0655 |
| 2022/0319624 A1* | 10/2022 | Cheng | G11C 29/42 |

\* cited by examiner

DATA RECOVERY BYPASSING PROTOCOL FOR CLOUD NETWORK STORAGE SYSTEM

BACKGROUND

Data storage has increasingly entered the domain of cloud computing, wherein the hosting of file systems on networked, distributed servers allows availability and reliability of remotely stored files to be greatly enhanced, and enables data workloads to be serviced by likewise distributed computing resources, which may be scaled to meet the needs of large-scale computation applications and projects. As a consequence, it is desired to configure data storage systems to behave in ways that improve performance and reliability.

For example, storage servers commonly implement a Redundant Array of Independent Disks ("RAID") over storage devices, to safeguard against loss of data in the event of storage device failures. While RAID may be implemented in many possible configurations across differently-configured storage systems, on storage systems implemented across networked, distributed storage servers, implementations of RAID may utilize striping, such that data is stored across multiple storage devices instead of a single storage device, improving read and write throughput.

As striping does not inherently provide redundancy to avert storage device failure and data loss, implementations of RAID may further utilize parity or mirroring, such that, upon a failure of one storage device, lost data may be reconstructed by reading parity data stored on non-failed storage devices, or lost data may be preserved on non-failed storage devices. Since implementations of mirroring require substantially compounded numbers of storage devices, parity is commonly favored for RAID to lower costs of implementation and maintenance.

Storage systems increasingly implement storage devices using flash memory, increasing storage costs and further incentivizing the use of parity over mirroring for RAID. However, implementations of parity on flash memory tend to exacerbate read latency during the process of reconstructing lost data. Consequently, in storage systems implementing RAID and utilizing parity, where storage devices are furthermore implemented using flash memory, it is desired to improve read performance following device failures during RAID-based reconstructing of lost data.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Systems and methods discussed herein are directed to implementing storage systems on cloud networks, and more specifically implementing a data recovery bypassing protocol, by which a storage node of a cloud network may return a replica of lost data being recovered to timely service a read operation call from a computing node of the cloud network, without waiting for completion of a secondary recovery process.

Figure 1:
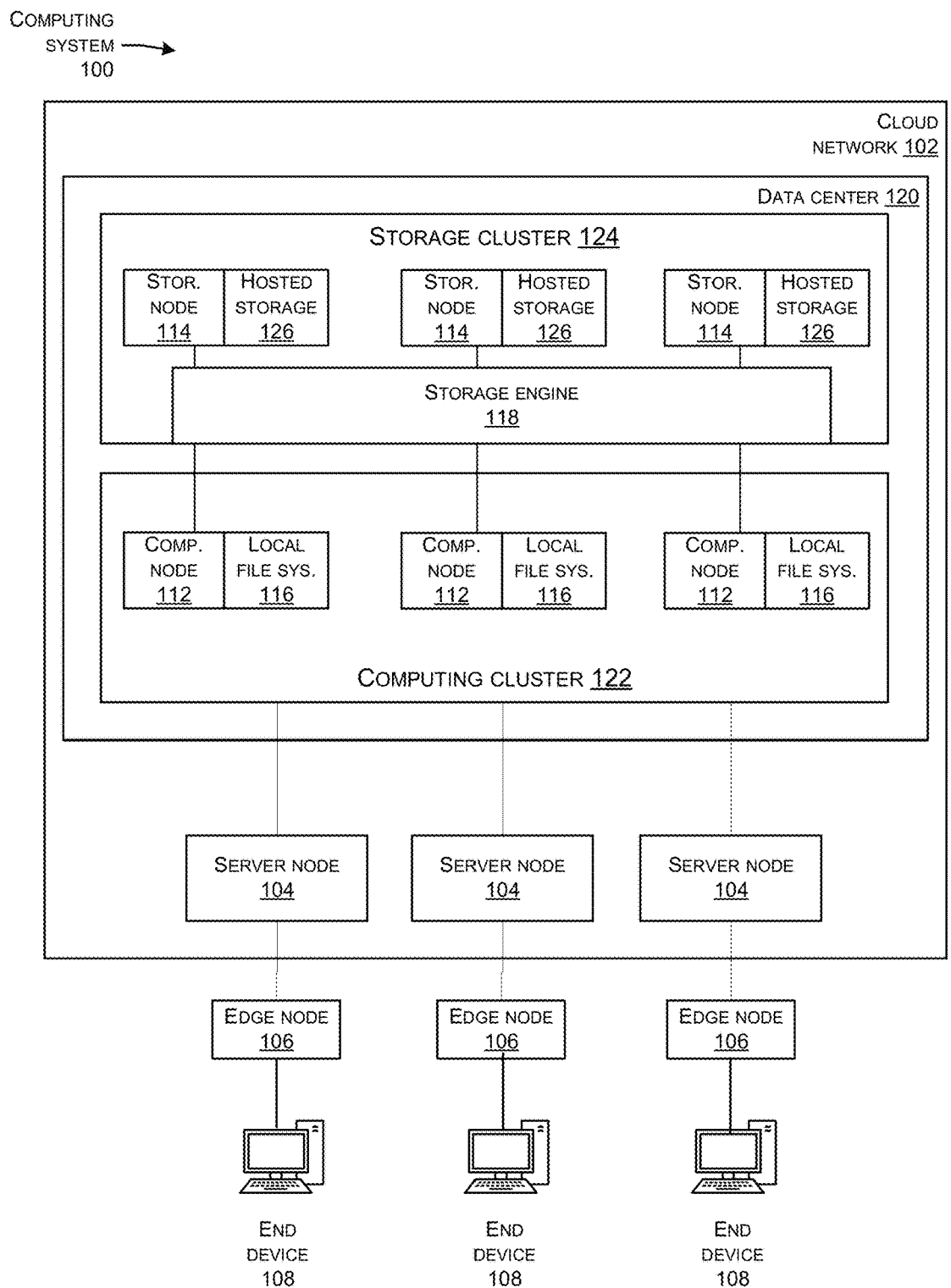
FIG. 1 illustrates an architectural diagram of a computing system according to example embodiments of the present disclosure.

FIG. 1 illustrates an architectural diagram of a computing system 100 according to example embodiments of the present disclosure. The computing system 100 may be a cloud computing system, which may provide collections of servers hosting storage resources and computing resources to provide distributed file systems, distributed and parallel computing, improved availability of physical or virtual storage resources and computing resources, and such benefits.

The computing system 100 may be implemented over a cloud network 102 of physical or virtual server nodes 104 connected by physical or virtual network connections. Furthermore, the network 102 may terminate at physical or virtual edge nodes 106 located at physical and/or logical edges of the cloud network 102. The edge nodes 106 may connect to any number of end devices 108.

At least some server nodes 104 of the cloud network 102 may be computing nodes 112, and at least some server nodes 104 of the cloud network 102 may be storage nodes 114.

Computing nodes 112 may be organized into any number of computing clusters 122. Each computing node 112 may implement a local file system 116, as shall be described subsequently, servicing a random-access write data storage workload. Each computing node 112 may further host service(s) responsible for a computing workload, or a portion of a distributed computing workload, where each such workload may generate data to be written to storage, such as at hosted storage of one or more storage nodes 114 in manners as shall be described subsequently.

The hosted services may be accessed over network connections by some number of end devices 108, which may act as clients of the hosted services in utilizing computing resources of the computing nodes 112 to perform computing tasks. The computing nodes 112 may, in turn, act as clients of a distributed file system ("DFS") hosted at one or more storage clusters 124, in utilizing the DFS as an extension of, or the entirety of, storage for computing tasks executed by those computing nodes 112 in manners as known to persons skilled in the art.

Storage nodes 114 may be organized into any number of storage clusters 124. A storage engine 118 may be implemented across storage nodes of a storage cluster 124. Some number of storage clusters may be hosted at one or more data centers 120, where a data center 120 may include some number of storage nodes 114 logically organized into some number of storage clusters. A data center 120 may service file read and write operations transmitted over a network by local file systems of any number of computing nodes 112 of any number of computing clusters, the local file systems acting as clients of the DFS, by dynamically allocating any number of storage clusters to provide storage volumes for one or more computing tasks which generate the file read and write operations.

According to implementations of a DFS, within a storage cluster, storage nodes 114 therein may include a master node and multiple chunk nodes. A storage engine 118 hosted at a storage node 114 of a storage cluster may configure both the master node of the storage cluster, and each chunk node of the storage cluster, to each communicate with any number of clients of the DFS (including local file systems of any number of computing nodes 112 of any number of computing clusters of the cloud network 102) by any number of network connections according to a file system communication protocol which implements one or more application programming interfaces ("APIs") providing read and write calls. File operation calls include, for example, API calls which cause an OS running on each chunk node to create files, delete files, read from files, write to files, rename files, move a file from one location to another location in a file system hierarchy, and the like.

Physical and/or virtual storage ("hosted storage 126") may be hosted at each storage node 114. For example, the physical and/or virtual storage may be hosted at one or more chunk nodes of a storage cluster. Data may be stored as logical blocks of a predetermined size, which may each be individually referred to as a "chunk." The storage engine 118 may configure the chunk nodes, in conjunction, to create multiple replicas of each individual chunk of data, where individual replicas may be stored distributed on multiple chunk nodes, providing redundancy and increasing availability of all chunks of data stored at the storage cluster.

The storage engine 118 may further configure each chunk node to perform memory operations and disk operations upon the hosted storage 126. For example, a chunk node may be configured to read data stored on hosted storage 126, write data to hosted storage 126, copy data from one address to another or from one logical block to another on hosted storage 126, move data from one address to another or from one logical block to another on hosted storage 126, and the like. Such disk operations may be performed by a file system in manners as known to persons skilled in the art.

The storage engine 118 may further configure a master node to store metadata pertaining to locations of each block of data among the chunk nodes. The metadata may provide mapping between files according to a file system hierarchy (as defined by the storage engine 118) and each block of data making up the file, including replicas thereof as located amongst the chunk nodes.

File system communication protocols as described herein may implement APIs such as Portable Operating System Interface ("POSIX"), Filesystem in Userspace ("FUSE"), Network File System ("NFS"), Representational State Transfer ("REST") APIs, and the like. In general, file system communication protocols as described herein may implement remote procedure calls ("RPCs") according to any suitable file system communication protocol as known to persons skilled in the art.

Hosted storage 126 may include various forms of computer-readable storage media, which may include volatile memory (such as random-access memory ("RAM")) and/or non-volatile memory (such as read-only memory ("ROM"), flash memory, storage class memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transient computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory ("PRAM"), static random-access memory ("SRAM"), dynamic random-access memory ("DRAM"), other types of random-access memory ("RAM"), read-only memory ("ROM"), electrically erasable programmable read-only memory ("EEPROM"), flash memory or other memory technology, compact disk read-only memory ("CD-ROM"), digital versatile disks ("DVD") or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

According to example embodiments of the present disclosure, hosted storage 126 may at least include some number of physical and/or virtual storage devices implemented at least in part using flash memory, such as solid-state drives ("SSDs").

Furthermore, flash memory according to example embodiments of the present disclosure may be configured to store multiple bits on each flash memory cell, such as according to triple-level cell ("TLC") or quad-level cell ("QLC") flash memory implemented as known to persons skilled in the art. However, it is furthermore known to persons skilled in the art that implementations of TLC and QLC results in density of data storage which challenges known manufacturing processes: TLC and QLC flash memory, in performance tests, tend to exhibit heightened raw bit error rate ("RBER") corresponding to increase in storage density. Such bit errors may be attributed to noise phenomena which are characteristic of flash memory, such as retention interference, read disturb errors, and/or wordline ("WL") interference caused by WL-WL coupling, each of these noise phenomena being known to persons skilled in the art.

In accordance with the noisy-channel coding theorem as known to persons skilled in the art, any flash memory cell may be modeled as a "noisy channel," which describes the cell as a communication channel which may carry data with or without errors, and describes the Shannon limit of the cell, the maximum rate at which data may be carried error-free over the channel. These terms, as known to persons skilled in the art, shall be referenced subsequently.

A primary recovery engine may be configured on a storage controller of each storage device of the hosted storage 126. The primary recovery engine may be configured to, for each chunk of data written to a storage device, generate and record a corresponding ECC. During retrieval of a chunk of data, such as in response to a read operation, the primary recovery engine may be configured to check a corresponding ECC to determine whether errors exist in the retrieved chunk, and to correct those errors, in manners as known to persons skilled in the art. Furthermore, for dense flash memory such as TLC and QLC flash memory, the primary recovery engine may be configured to generate and record one or more ECCs, including multi-byte ECCs such as BCH codes, and low-density parity check ("LDPC") codes, as known to persons skilled in the art.

By implementation of such ECC techniques, the hosted storage 126 may be configured to write data and read data at accuracy rates approaching the theoretical Shannon limit of the underlying storage devices: by checking ECCs and correcting detected errors accordingly, given storage device RBERs under than some particular threshold, the primary recovery engine may recover all corrupted data.

Hosted storage 126 according to example embodiments of the present disclosure may further be configured to implement a Redundant Array of Independent Disks ("RAID") over flash memory storage devices. In accordance with the noisy channel model, RAID implementations according to example embodiments of the present disclosure may be any of several RAID implementations utilizing striping of data across multiple (e.g., networked and distributed) storage devices, as well as utilizing parity, such as RAID5 as known to persons skilled in the art. Such implementations may enable the hosted storage 126 to recover lost or corrupted data even in the event that the primary recovery engine fails to recover the corrupted data.

By implementation of a computing system 100 as described above, computing tasks which include some number of computer-executable instructions may originate locally from end devices 108, which may make hosted service API calls to computing nodes 112 of a computing cluster, causing those computing nodes 112 to execute the computer-executable instructions making up the computing tasks. The execution of the computer-executable instructions may configure local file systems of the computing nodes 112, as DFS clients, to make file operation API calls (in accordance with any suitable file system communication protocol under RPC as described above) to the storage engine 118 implemented on storage nodes 114 of one or more storage clusters, including master nodes and chunk nodes. Data generated by the execution of the computer-executable instructions making up the computing tasks may then be stored at the chunk nodes in chunks, in some number of replicas.

Figure 2:
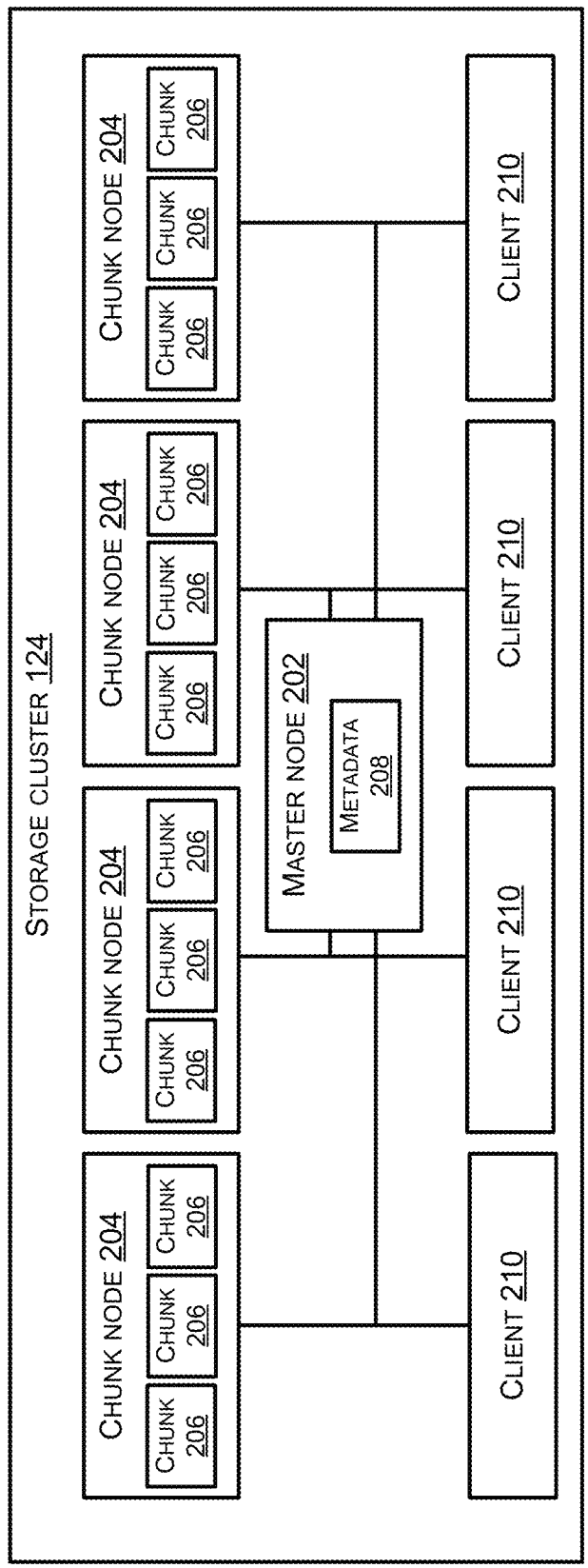
FIG. 2 illustrates an architectural diagram of storage nodes of a storage cluster according to example embodiments of the present disclosure.

FIG. 2 illustrates an architectural diagram of storage nodes of a storage cluster 124 according to example embodiments of the present disclosure. Illustrated are the master node 202 and some number of chunk nodes 204. Each chunk node 204 stores some number of chunks 206, where any chunk stored on an individual chunk node 204 may be a straight replica or an erasure encoded replica of at least some number of other chunks stored on other individual chunk nodes 204. The master node 202 stores metadata 208 which provides mapping between files according to a file system hierarchy (as defined by the DFS) and each block of data making up the file, including replicas thereof as located amongst the chunk nodes 204.

Clients 210 of the DFS hosted on the storage nodes 114 may be respective local file systems of any computing system performing computational tasks and utilizing the DFS hosted on the storage nodes 114 as extensions of local storage, in place of local storage, in the capacity of virtualizing local storage, and the like. For example, clients 210 may be local file systems of server nodes 104 of a cloud network 102 other than the storage nodes 114, such as computing nodes 112 of the cloud network 102.

Each chunk node 204 may be configured to perform disk operations such as reading data stored on hosted storage 126, writing data to hosted storage 126, copying data from one address to another or from one logical block to another on hosted storage 126, moving data from one address to another or from one logical block to another on hosted storage 126, and the like. Each such disk operation may be performed by calls to a storage engine 118 of a respective chunk node 204.

According to example embodiments of the present disclosure, a local file system 116 implemented at some number of computing nodes 116 of a computing cluster, and a storage engine 118 implemented at some number of storage nodes 114 of storage cluster, may implement APIs such as Portable Operating System Interface ("POSIX"), Filesystem in Userspace ("FUSE"), Network File System ("NFS"), Representational State Transfer ("REST") APIs, and the like. These APIs, facing the local file system 116 in its capacity as a client of the DFS, may provide abstractions which hide physical and logical organization of underlying hosted storage from the local file system 116.

Figure 3:
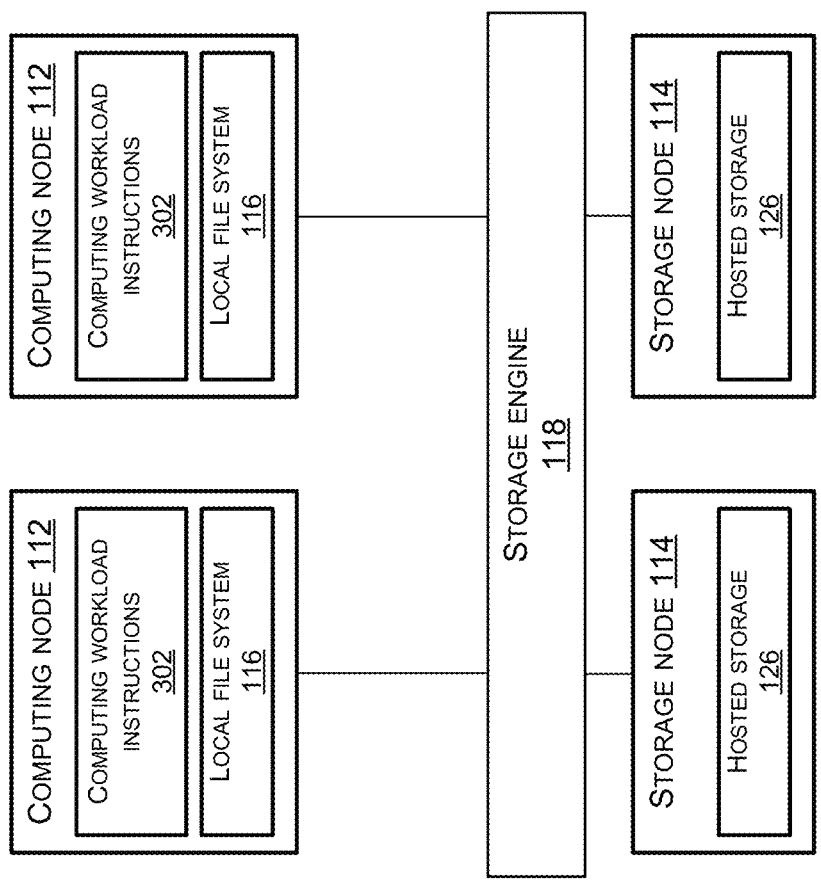
FIG. 3 illustrates a detailed view of a local file system implemented at one or more computing nodes according to example embodiments of the present disclosure.

FIG. 3 illustrates a detailed view of a local file system 116 implemented at one or more computing nodes 112 according to example embodiments of the present disclosure.

According to example embodiments of the present disclosure, a local file system 116 may be implemented by one or more sets of computer-executable instructions running in kernel space of the computing node 112, such that the instructions are loaded into memory during or immediately after booting of the computing node 112, and the instructions may interface with OS-level read and write calls which are otherwise hidden from applications running in user space.

However, alternatively, a local file system 116 need not be implemented in a kernel of a computing node 112. A local file system 116 may be implemented by one or more sets of computer-executable instructions running in user space of the computing node 112.

As described above, computing nodes 112 further execute one or more sets of computer-executable instructions making up various computing tasks. For clarity, these instructions shall be referred to as computing workload instructions 302 as illustrated in FIG. 3, to be distinguished from the computer-executable instructions implementing the local file system 116. However, computing workload instructions 302 may run in user space of the computing node 112, regardless of whether the local file system 116 runs in kernel space or in user space.

The execution of computing workload instructions 302 may require reads and writes to files stored at hosted storage of any number of storage nodes of storage clusters as described above. Thus, the computing workload instructions 302 may generate file operation calls in accordance with various file system APIs such as POSIX, FUSE, NFS, and the like. Furthermore, computing workload instructions 302 corresponding to a same computing task may generate file operation calls in accordance with two or more file system APIs, which may be, respectively, supported by a local file system 116 and a storage engine 118. For example, file operation calls which cause random-access reads and/or random-access writes may be in accordance with a first file system API (such as, for example, POSIX), and file operations which do not cause either random-access reads or random-access writes may be in accordance with a second file system API supported by a storage engine 118.

According to example embodiments of the present disclosure, the computing workload instructions 302 may interface with the local file system 116 by standard file system API calls (that is, a first file system API as referenced above), which may be kernel-level API calls supported by an operating system running on the computing node 112.

According to example embodiments of the present disclosure, in the event that the local file system 116 runs in kernel space, the local file system 116 may replace certain standard file system API calls, causing the standard file system API calls to configure the computing node 112 to run computer-executable instructions as defined by the local file system 116.

According to example embodiments of the present disclosure, in the event that the local file system 116 runs in user space, the local file system 116 may not be able to replace any standard file system API calls, and may not be able to define any API calls having the same names as standard file system API calls. Instead, according to example embodiments of the present disclosure, the computing node 112 may further be configured with indirect symbol resolution of at least some standard file system API calls.

Indirect symbol resolution, as defined here according to example embodiments of the present disclosure, may refer to one of several possible mechanisms by which standard file system API calls being executed by the computing node 112 may configure the computing node 112 to run instructions different than the computer-executable instructions executed by those API calls during normal operation. For example, indirect symbol resolution may be implemented as a dynamic linker, such as the LD_PRELOAD environmental variable in Unix-based operating systems, which may configure the computing node 112 to override certain file system API calls. Alternatively, indirect symbol resolution may be implemented as a module implemented according to FUSE or other virtual file system APIs as known to persons skilled in the art which are operative to translate standard file system API calls in accordance with a hierarchy of a virtual file system.

Indirect symbol resolution according to example embodiments of the present disclosure may merely be a first level of indirection, wherein standard file system API calls are translated to API calls of the local file system; another level of indirection, as shall be described subsequently, may translate API calls of the local file system to API calls compatible with a storage engine, as shall be described subsequently.

The execution of computing workload instructions by a computing node 112 may configure the computing node 112 to make local file operation API calls to the local file system 116, and configure the local file system 116, as a DFS client, to make distributed file operation API calls to the storage engine 118 implemented on storage nodes 114 of one or more storage clusters, including master nodes 202 and chunk nodes 204. The local file system 116, as a DFS client, may then translate the local file operation API calls to further distributed file operation API calls to the storage engine 118. Consequently, according to example embodiments of the present disclosure, in both cases, data generated by the execution of the computing workload instructions may then be stored at the chunk nodes 204 in chunks, in some number of replicas.

Figure 4:
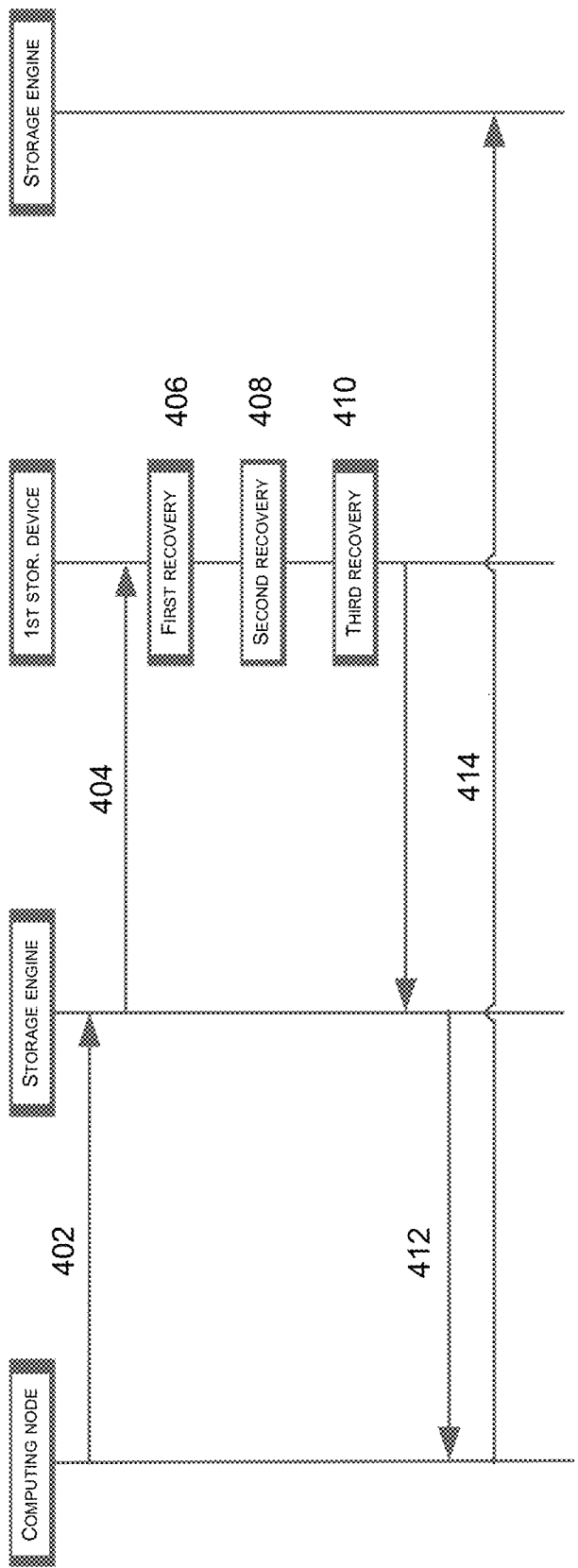
FIG. 4 illustrates a swim lane diagram depicting data recovery by a computing system according to example embodiments of the present disclosure.

FIG. 4 illustrates a swim lane diagram depicting data recovery by a computing system according to example embodiments of the present disclosure.

At a step 402, a computing node of a cloud network transmits a read operation call to a first storage node of the cloud network.

At a step 404, the first storage node sends the read operation call to a storage device of hosted storage of the first storage node.

A local file system of the storage node may resolve the read operation call by translating the read operation call, which need not be described in further detail. However, the servicing of the read operation is further complicated in the event that the storage device needs to invoke one or more of several recovery functions, as shall be described subsequently. Recovery operations may include hard-decision decoding computations, soft-decision decoding computations, and a RAID recovery process.

At a step 406, a primary recovery engine of the storage device performs a first recovery function returning a failure.

It should be understood that the storage device is resolving the read operation call by translating the read operation call to one or more chunks having corresponding ECCs; in the course of checking one or more of the corresponding ECCs, the primary recovery engine detected one or more errors in one or more chunks (henceforth these chunks being referenced as "corrupted chunk(s)"). It should further be understood that, in response to detecting one or more errors, the primary recovery engine performs one or more first recovery function computations (e.g., hard-decision decoding computations) to attempt to reconstruct data lost due to the one or more errors. The primary recovery engine fails in one or more hard-decision decoding computations, and does not reconstruct one or more bits of lost data as a result.

The primary recovery engine may be configured to perform soft-decision decoding by reading a flash memory cell array one time based on a reference voltage ("VREF") so as to determine voltage distribution in each cell of the cell array, reconstructing lost data by generating a bit value for each cell (i.e., either a 0 or a 1). Otherwise, implementations of hard-decision decoding are as known to persons skilled in the art and need not be further detailed herein for understanding example embodiments of the present disclosure, except as below with reference to step 408.

At a step 408, the primary recovery engine of the storage device performs a second recovery function returning a failure.

Due to the decode failure resulting from the one or more hard-decision decoding computations, as a backup recovery measure, the primary recovery engine performs one or more second recovery function computations (e.g., soft-decision decoding computations) to attempt to reconstruct the lost data.

The primary recovery engine may be configured to perform soft-decision decoding by reading a flash memory cell array multiple times based on multiple different VREFs, each time generating a bit value for each cell, and recording each sample of bit values in one or more buffers. Such repeated sampling of bit values improves accuracy of the bit values generated to reconstruct lost data, but utilizes the flash memory cell array in a blocking fashion for the duration of the soft-decision decoding computations.

Consequently, implementations of soft-decision decoding as known to persons skilled in the art need not be further detailed herein for understanding example embodiments of the present disclosure, except to say that, relative to hard-decision decoding, a primary recovery engine may be configured to perform a soft-decision decoding computation hundreds of times slower in order of magnitude than a hard-decision decoding computation. For example, given a computing system wherein the primary recovery engine is configured to perform one hard-decision decoding computation in several tens of microseconds, the primary recovery engine may be configured to perform one soft-decision decoding computation in several milliseconds in contrast. Since the flash memory cell array is blocked from other read and write operations during this time, quality of service ("QoS") of the computing system 100 may observably degrade due to read and write operations of computing workloads at computing nodes 112 being blocked.

At a step 410, a secondary recovery engine of the storage device begins a third recovery function across the storage node 112.

Due to the decode failures resulting from both the one or more hard-decision decoding computations and the one or more soft-decision decoding computations, the secondary recovery engine begins performing a third recovery function (e.g., a RAID recovery process) as known to persons skilled in the art. Since, according to example embodiments of the present disclosure, RAID is implemented utilizing striping of data across multiple storage devices, the secondary recovery engine may be configured to reconstruct lost data by reading each stripe across multiple storage devices except those stripes encompassing the one or more corrupted chunk (s), and performing an exclusive OR ("XOR") computation across each read stripe. Additionally, since RAID is implemented using parity, the secondary recovery engine may be configured to reconstruct lost data by performing low-density parity check ("LDPC") soft decoding computations, as known to persons skilled in the art.

Implementations of RAID recovery as known to persons skilled in the art need not be further detailed herein for understanding example embodiments of the present disclosure, except to say that, relative to hard-decision decoding and soft-decision coding, a secondary recovery engine may be configured to perform RAID recovery tens of times slower in order of magnitude than a soft-decision decoding computation, and thousands of times slower in order of magnitude than a hard-decision decoding computation. For example, given a computing system wherein the primary recovery engine is configured to perform one hard-decision decoding computation in several tens of microseconds, and one soft-decision decoding computation in several milliseconds, the secondary recovery engine may be configured to perform one RAID recovery in several tens of milliseconds in contrast. Since all flash memory cells of multiple storage devices are blocked from other read and write operations during this time, QoS of the computing system 100 may observably degrade due to read and write operations of computing workloads at computing nodes 112 being blocked for periods over and above blocking resulting from soft-decision decoding computations.

Additionally, QoS is further observably degraded in the event that the storage node 114 cannot service the original read operation call until after the RAID recovery process completes.

Consequently, example embodiments of the present disclosure provide a data recovery bypassing protocol, by which a storage node of a cloud network may return a replica of lost data being recovered to timely service a read operation call from a computing node of the cloud network, without waiting for completion of a first, a second, and a third recovery functions.

According to example embodiments of the present disclosure, storage devices further implement asynchronous event reporting ("AER") protocol between a storage engine 118 hosted on a storage node 114 and storage devices of the storage node 114. AER protocol may be implemented in accordance with error reporting on flash memory storage devices as known to persons skilled in the art. For the purpose of understanding example embodiments of the present disclosure, it should be understood that a storage device may, in accordance with AER, report one of several possible events, including errors, to the storage engine 118 by an AER message.

Furthermore, according to example embodiments of the present disclosure, within a storage device, an AER generation protocol may be implemented enabling a storage controller of the storage device and a flash memory cell array of the storage device to intercommunicate, and enabling the storage controller to generate AER messages.

Furthermore, according to example embodiments of the present disclosure, an RPC protocol may be implemented between computing nodes and storage nodes of the cloud network, enabling computing nodes to forward read operation calls according to RPC to a storage engine of storage nodes, and for storage nodes of storage engines to return success and failure messages to the computing nodes.

Each of the above intercommunication protocols implemented according to example embodiments of the present disclosure shall be subsequently illustrated.

Figure 5:
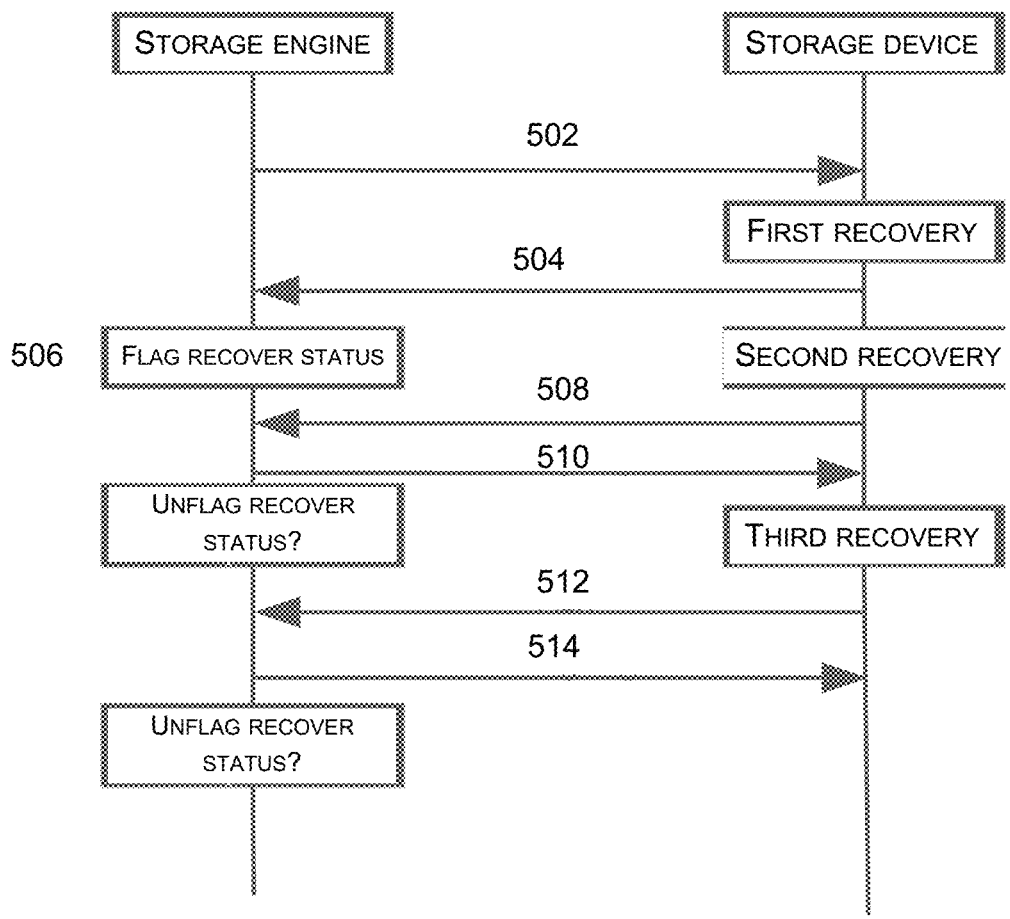
FIG. 5 illustrates a swim lane diagram depicting an AER protocol between a storage engine hosted on a storage node and storage devices of the storage node, according to example embodiments of the present disclosure.

FIG. 5 illustrates a swim lane diagram depicting an AER protocol 500 between a storage engine hosted on a storage node and storage devices of the storage node, according to example embodiments of the present disclosure.

At a step 502, a storage engine hosted on a storage node sends a read operation call to a storage device of the storage node.

The read operation call may be in accordance with any suitable protocol for communication with flash memory storage devices, such as, for example, Non-Volatile Memory Express ("NVMe").

At a step 504, the storage device returns an acknowledgement to the storage engine in response to the read operation call.

It should be understood that between steps 502 and 504, the storage device attempted to perform a read operation of one or more chunks, as well as check ECCs corresponding to those one or more chunks. In the event that the read operation is performed with a successful ECC check, the storage device may return a good status acknowledgement, alongside data of the one or more read chunks. In the event that the read operation is performed with a failed ECC check, a primary recovery engine of the storage device may additionally perform a first recovery function as described above; in the event that the first recovery function is successful, the storage device may return a good status acknowledgement, alongside reconstructed data of the one or more read chunks. However, in the event that the first recovery function also fails, the storage device may return a bad status acknowledgement, as well as a recovery flag indicating that recovery of data failed to be read is ongoing.

Subsequently, it is assumed for the purpose of understanding the present disclosure that a bad status acknowledgement was returned.

At a step 506, the storage engine flags one or more logical blocks as undergoing recovery.

In response to the recovery flag, the storage engine marks all logical blocks that the storage device failed to read, and subsequently blocks all subsequent operation calls targeting the marked blocks. The storage engine also communicates with the computing node to report the ongoing recovery, as shall be subsequently described with reference to FIG. 7.

At a step 508, the storage device returns an AER indicating a second recovery function result to the storage engine.

It should be understood that between steps 506 and 508, a primary recovery engine of the storage device attempted to perform a second recovery function as described above as a backup for the failed first recovery function; in the event that the first recovery function is successful, the storage device may return an AER, and record a good status and the one or more read chunks in a log page. However, in the event that the second recovery function also fails, the storage device may return an AER, and record a bad status and the one or more unsuccessfully read chunks in a log page.

Subsequently, it is assumed for the purpose of understanding the present disclosure that a bad status acknowledgement was recorded.

At a step 510, the storage engine retrieves a log page from the storage device.

In this fashion, the storage engine may determine whether the second recovery function succeeded or failed. In the event that the storage engine retrieves a good status, the storage engine may unflag the logical blocks recorded in the log page, enabling further operation calls targeting those blocks.

At a step 512, the storage device returns an AER indicating a third recovery function result to the storage engine.

It should be understood that between steps 508 and 512, a secondary recovery engine of the storage device attempted to perform a third recovery function as described above as a backup for the failed first recovery function and the failed second recovery function; in the event that the third recovery function is successful, the storage device may return an AER, and record a good status and the one or more read chunks in a log page. However, in the event that the third recovery function also fails, the storage device may return an AER, and record a bad status and the one or more chunks that the storage device failed to read in a log page.

At a step 514, the storage engine retrieves a log page from the storage device.

In this fashion, the storage engine may determine whether the third recovery function succeeded or failed. In the event that the storage engine retrieves a good status, the storage engine may unflag the logical blocks recorded in the log page, enabling further operation calls targeting those blocks.

Additionally, in the event that the storage engine retrieves an uncorrectable status, the storage engine may subsequently return the uncorrectable status to a computing node as subsequently described with reference to FIG. 7.

Figure 6:
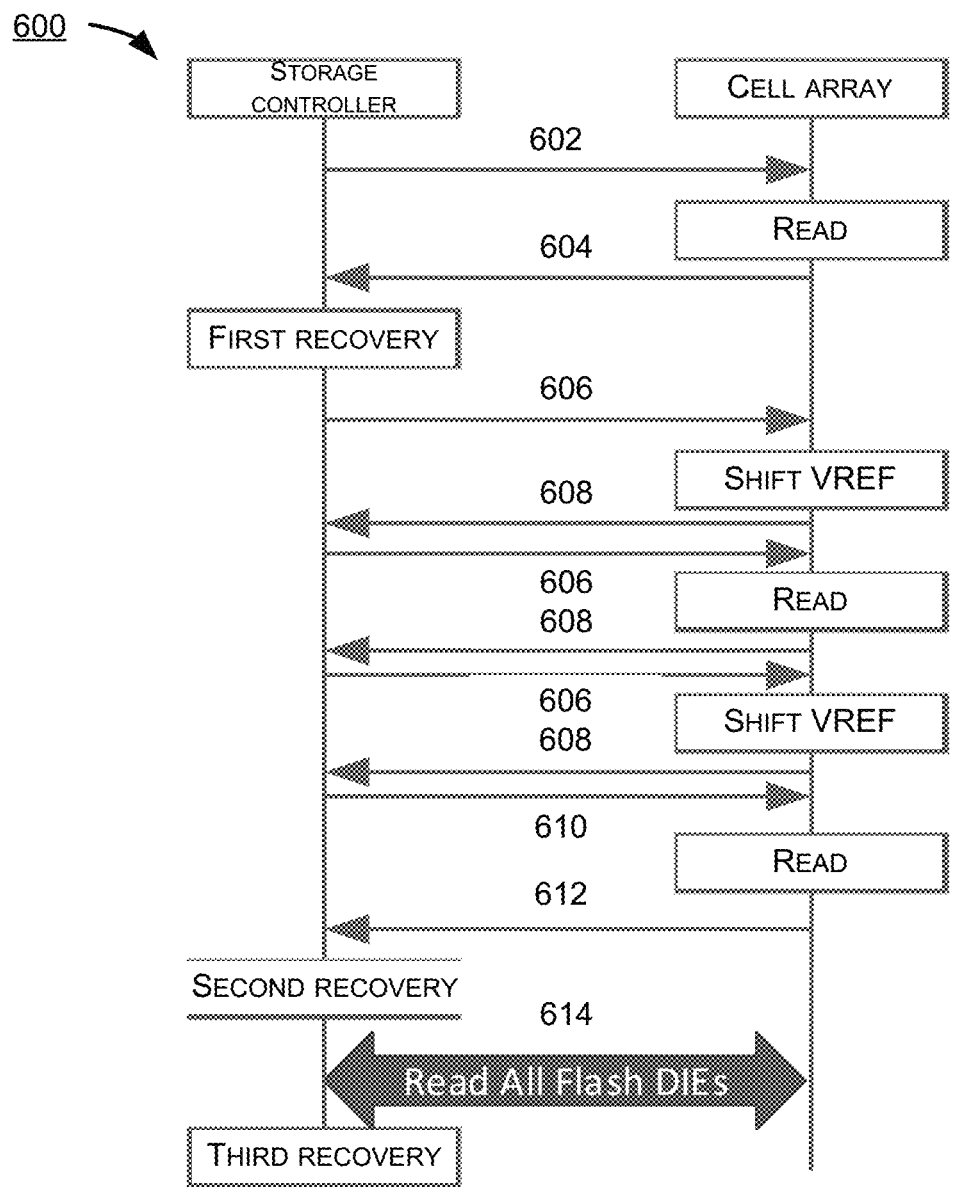
FIG. 6 illustrates a swim lane diagram depicting an AER generation protocol between a storage controller of a storage device and a flash memory cell array of the storage device, according to example embodiments of the present disclosure.

FIG. 6 illustrates a swim lane diagram depicting an AER generation protocol 600 between a storage controller of a storage device and a flash memory cell array of the storage device, according to example embodiments of the present disclosure.

At a step 602, a storage controller of a storage device sends a read operation call to a cell array of the storage device.

As mentioned above, the read operation call may be in accordance with any suitable protocol for communication with flash memory storage devices, such as, for example, NVMe.

At a step 604, the cell array returns a read status to the storage controller.

It should be understood that between steps 602 and 604, the cell array attempted to read one or more chunks specified by the read operation call. This read may either succeed or fail.

Subsequently, the storage controller may perform a first recovery function as described above, which may either succeed or fail. In the event of a success, the storage controller returns a good status acknowledgement to a storage engine as described above with reference to FIG. 5. In the event of a failure, the storage controller returns a bad status acknowledgement to a storage engine as described above with reference to FIG. 5, and moreover the storage controller records a first-level recovery level in a log page. Subsequently, it is assumed for the purpose of understanding the present disclosure that a bad status acknowledgement was returned.

At a step 606, the storage controller trims a reference voltage of the cell array.

At a step 608, the cell array returns a reference voltage status to the storage controller.

At a step 610, the storage controller sends a read operation call to the cell array.

At a step 612, the cell array returns a read status to the storage controller.

Each of the above steps 606 to 612 should be understood as implementing a second recovery function as known to persons skilled in the art. Moreover, each of the above steps 606 to 612 may be repeated several times in order to sample multiple bit values in response to the read operation call (e.g., three times, for 3-bit soft decision decode).

In accordance with the above steps, the second recovery function may either succeed or fail. In the event of a success, the storage controller returns an AER and records a good status acknowledgement and the one or more read chunks in a log page as described above with reference to FIG. 5. In the event of a failure, the storage controller returns an AER and records a bad status acknowledgement and the one or more unsuccessfully read chunks in a log page as described above with reference to FIG. 5, and moreover the storage controller records a second-level recovery level in a log page. Subsequently, it is assumed for the purpose of understanding the present disclosure that a bad status acknowledgement was recorded.

At a step 614, the storage controller performs a third recovery function.

It should be understood that the storage controller now proceeds to read each flash die of the entire cell array in order to read each stripe of the data to be recovered. As described above, in the event that the third recovery function is successful, the storage controller returns an AER, and records a good status and the one or more read chunks in a log page. In the event that the third recovery function also fails, the storage controller returns an AER, and records an uncorrectable error status and the one or more chunks that the storage device failed to read in a log page.

The uncorrectable error status may indicate that the storage device has exhausted all procedures for error correction but could not reconstruct lost data at one or more chunks. Thus, the storage device ultimately cannot service the read operation call.

Figure 7:
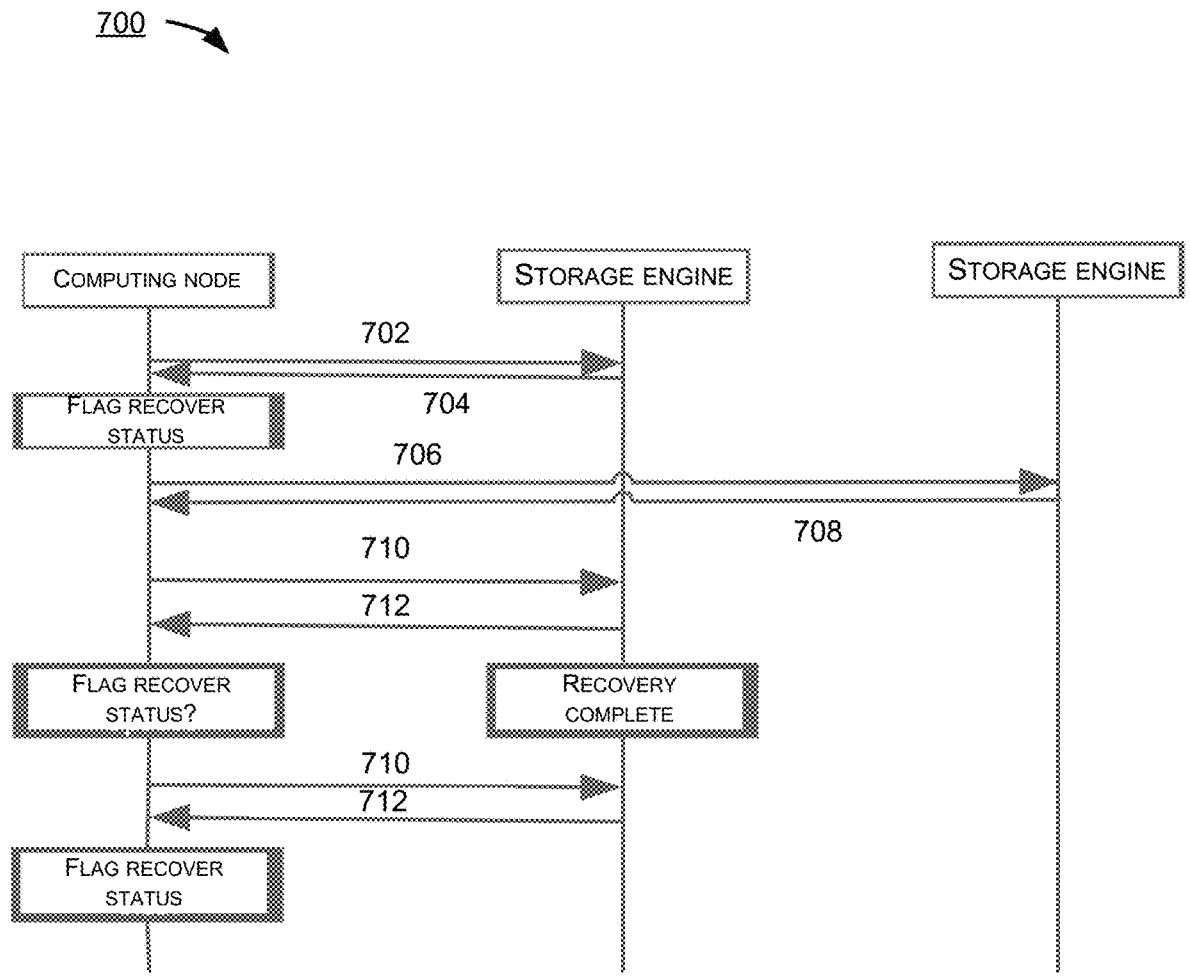
FIG. 7 illustrates a swim lane diagram depicting an RPC protocol between a computing node and storage nodes of a cloud network, according to example embodiments of the present disclosure.

FIG. 7 illustrates a swim lane diagram depicting an RPC protocol 700 between a computing node and storage nodes of a cloud network, according to example embodiments of the present disclosure.

It should be understood that the computing node may be any arbitrary computing node among the cloud network, and the storage nodes may be any arbitrary storage nodes among the cloud network, as described above with reference to the architecture of the computing system 100 and with reference to FIG. 1.

At a step 702, the computing node sends a read operation call to a storage engine hosted on a first storage node.

At a step 704, the storage engine hosted on the first storage node returns a read status to the computing node.

As described above, the storage engine may have flagged one or more logical blocks as undergoing recovery; in the event that the storage engine has not flagged logical blocks as undergoing recovery, the storage engine may return a good read status. However, in the event that the storage engine has flagged one or more logical blocks as undergoing recovery, the storage engine may return a bad read status.

At a step 706, the computing node sends a read operation call to a storage engine hosted on a second storage node.

It should be understood that, according to example embodiments of the present disclosure, the chunks to be read are still undergoing recovery on hosted storage of the first storage node; consequently, the computing node bypasses the data recovery at the first storage node, and proceeds to retry the read operation call at any other storage node.

At a step 708, the storage engine hosted on the second storage node returns a read status to the computing node.

It should be understood that the computing node will continue to retry the read operation call at each storage node of the cloud network until any storage engine returns a good read status, or until storage engines of all storage nodes return bad read statuses. In the event that any storage engine returns a good read status, the read operation call successfully retrieves the data to be read. In the event that storage engines of all storage nodes return bad read statuses, data recovery cannot be bypassed at any of the storage nodes, and the computing node ultimately returns to polling the storage engine of the first storage node until data recovery completes at the first storage node, as shall be described subsequently.

At a step 710, the computing node polls recovery status of the first storage node.

At a step 712, the storage engine hosted on the first storage node returns a recovery status to the computing node.

The storage engine hosted on the first storage node may either return an incomplete recovery status in the event that the chunks are still flagged, or may return a complete recovery status in the event that it has unflagged the chunks. It should be understood that recovery status polling and recovery status returning may both be communicated in accordance with RPC, as described above. The computing node and the storage engine hosted on the first storage node may, respectively, repeat steps 710 and 712 until the first storage node unflags the flagged chunks, whereupon the storage engine hosted on the first storage node is able to return a complete recovery status. Alternatively, the computing node and the storage engine hosted on the first storage node may, respectively, repeat steps 710 and 712 until the storage engine hosted on the first storage node returns an uncorrectable error status.

In the event that the storage engine hosted on the first storage node returns a complete recovery status, the storage engine also returns the read chunks to the computing node. In the event that any of the other storage nodes has recorded an uncorrectable error status, the storage engine may also forward the read chunks to the other storage nodes to refresh the lost data at those other storage nodes.

In the event that the storage engine hosted on the first storage node returns an uncorrectable recovery status, the computing node stops polling the storage engine; the read operation call has ultimately failed at all storage nodes.

Figure 8:
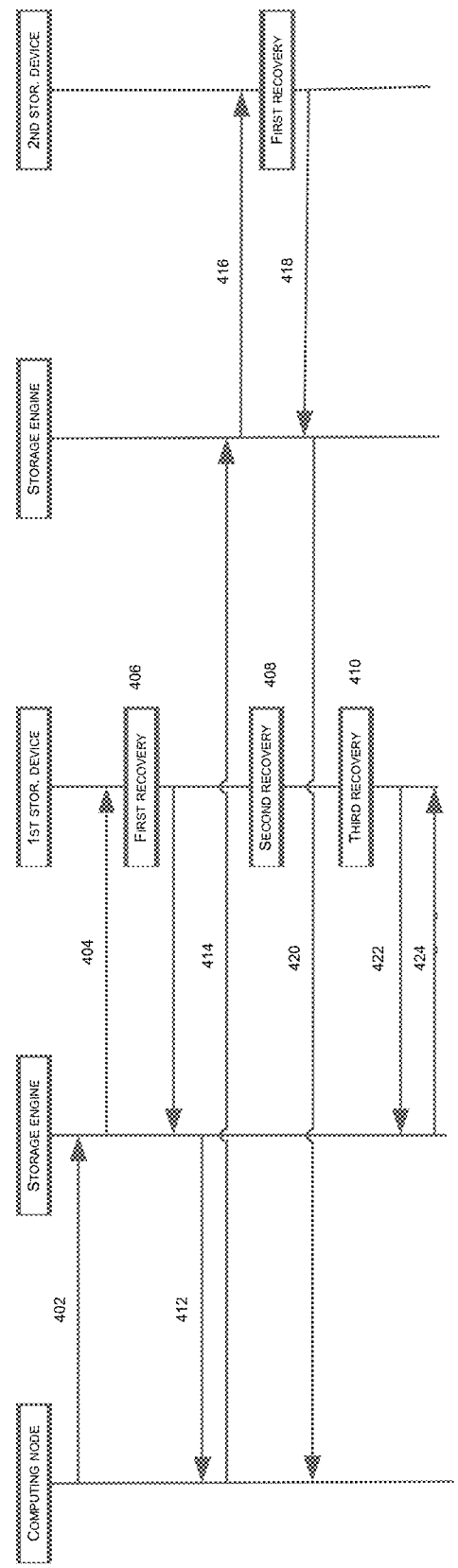
FIG. 8 illustrates a swim lane diagram depicting data recovery bypassing by a computing system according to example embodiments of the present disclosure.

FIG. 8 illustrates a swim lane diagram depicting data recovery bypassing by a computing system according to example embodiments of the present disclosure.

Continuing from step 410 as illustrated in FIG. 4, at a step 412, a storage engine hosted on the first storage node returns a read operation status to the computing node, as illustrated above in FIG. 7. The computing node determines, based on the read operation status, that the read operation call has failed at the first storage node, and recovery has not yet completed.

At a step 414, the computing node sends a read operation call to a storage engine hosted on the second storage node, as illustrated above in FIG. 7.

During this time, the first storage node may be performing a second recovery function computation, or may be performing a third recovery function, as described above.

At a step 416, the storage engine hosted on the second storage node sends the read operation call to a storage device of the second storage node, as illustrated above in FIG. 5.

Herein, the storage device may have performed various steps of the AER generation protocol as illustrate above in FIG. 6. For example, the storage device may perform a first recovery function, a second recovery function, and a third recovery function successfully or unsuccessfully. For the purpose of understanding example embodiments of the present disclosure, it is assumed that the storage device successfully performs a first recovery function and thereafter returns a good status acknowledgement in step 418.

At a step 418, the storage device of the second storage node returns an acknowledgement to the storage engine hosted on the second storage node in response to the read operation call, as illustrated above in FIG. 5.

At a step 420, the storage engine hosted on the second storage node returns a read status to the computing node, as illustrated above in FIG. 7.

At a step 422, the storage engine hosted on the first storage node returns an AER indicating a third recovery function result to the storage engine hosted on the first storage node.

It should be understood that before step 422, a secondary recovery engine of a storage device of the first storage node attempted to perform a third recovery function as described above as a backup for the failed first recovery function and the failed second recovery function; in the event that the third recovery function is successful, the storage device may return an AER, and record a good status and the one or more read chunks in a log page. However, in the event that the third recovery function also fails, the storage device may return an AER, and record a bad status and the one or more chunks that the storage device failed to read in a log page.

At a step 424, the storage engine hosted on the first storage node retrieves a log page from the storage device.

Although several tens of milliseconds may now have passed while the first storage node proceeds through the third recovery function, the computing node has now had opportunities to successfully read the lost data from many or all storage nodes of the cloud network. Consequently, as long as the lost data may be read from any other storage node, or may be reconstructed without resorting to the second recovery function or the third recovery function from any other storage node, the computing node may complete the read operation call without suffering milliseconds or tens of milliseconds in performance loss and blocking, averting observable degradation of QoS of the overall computing system.

Figure 9:
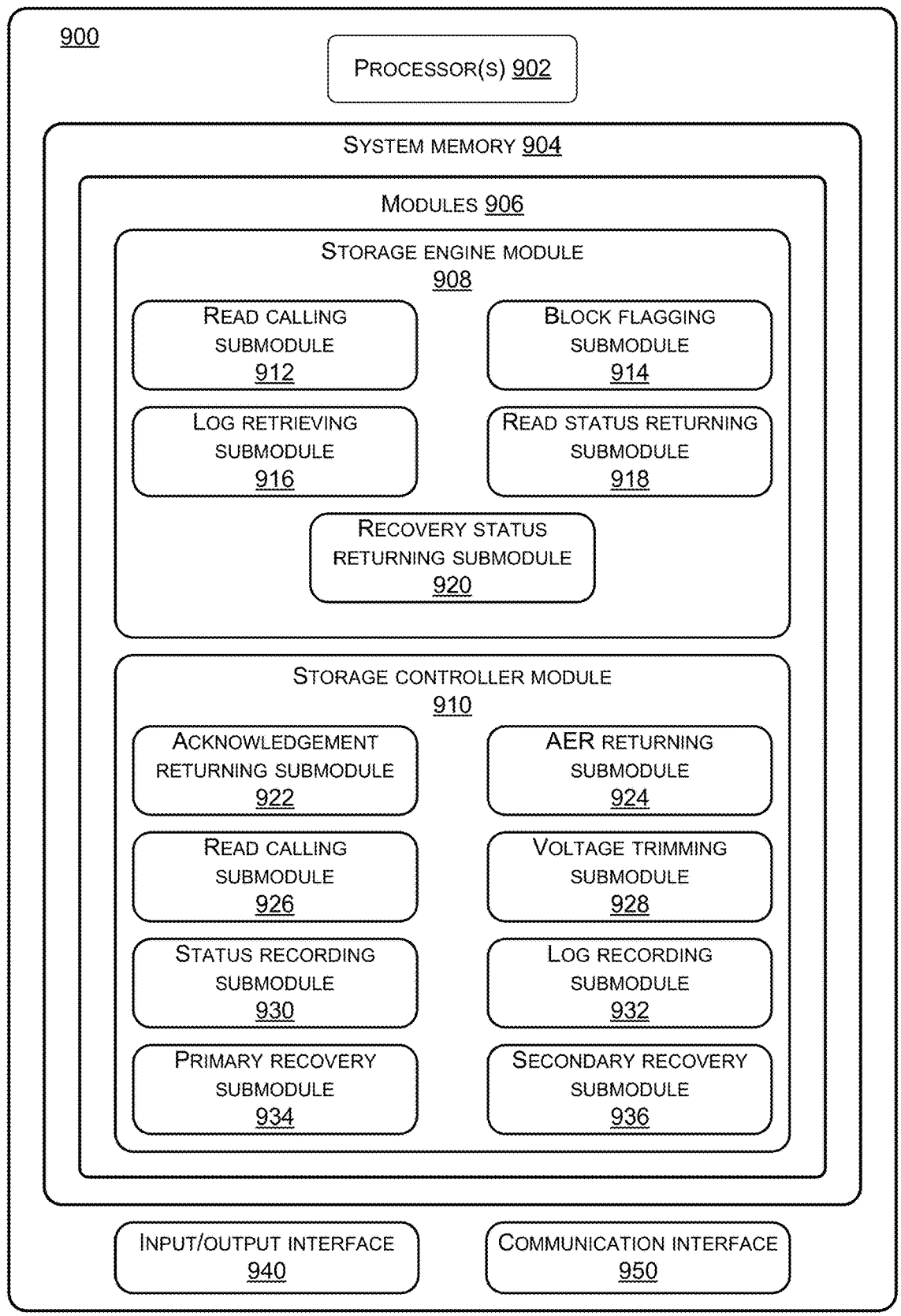
FIG. 9 illustrates an example storage system for implementing the processes and methods described herein.

FIG. 9 illustrates an example storage system 900 for implementing the processes and methods described above.

The techniques and mechanisms described herein may be implemented by multiple instances of the system 900, as well as by any other computing device, system, and/or environment. The system 900 may be a single computing system or an edge host providing physical or virtual computing resources as known by persons skilled in the art. Examples thereof include at least one node of a storage cluster as described herein. The system 900 shown in FIG. 9 is only one example of a system and is not intended to suggest any limitation as to the scope of use or functionality of any computing device utilized to perform the processes and/or procedures described above. Other well-known computing devices, systems, environments and/or configurations that may be suitable for use with the embodiments include, but are not limited to, personal computers, server computers, hand-held or laptop devices, multiprocessor systems, microprocessor-based systems, set top boxes, game consoles, programmable consumer electronics, network PCs, minicomputers, mainframe computers, distributed computing environments that include any of the above systems or devices, implementations using field programmable gate arrays ("FPGAs") and application specific integrated circuits ("ASICs"), and/or the like.

The system 900 may include one or more processors 902 and system memory 904 communicatively coupled to the processor(s) 902. The processor(s) 902 and system memory 904 may be physical or may be virtualized and/or distributed. The processor(s) 902 may execute one or more modules and/or processes to cause the processor(s) 902 to perform a variety of functions. In embodiments, the processor(s) 902 may include a central processing unit ("CPU"), a graphics processing unit ("GPU"), both CPU and GPU, or other processing units or components known in the art. Additionally, each of the processor(s) 902 may possess its own local memory, which also may store program modules, program data, and/or one or more operating systems.

Depending on the exact configuration and type of the system 900, the system memory 904 may be volatile, such as RAM, non-volatile, such as ROM, flash memory, miniature hard drive, memory card, and the like, or some combination thereof. The system memory 904 may include one or more computer-executable modules 906 that are executable by the processor(s) 902.

The modules 906 may include, but are not limited to, a storage engine module 908 and a storage controller module 910. The storage engine module 908 may further include a read calling submodule 912, a block flagging submodule 914, a log retrieving submodule 916, a read status returning submodule 918, and a recovery status returning submodule 920. The storage controller module 910 may further include an acknowledgement returning submodule 922, an AER returning submodule 924, a read calling submodule 926, a voltage trimming submodule 928, a status recording submodule 930, a log recording submodule 932, a primary recovery submodule 934, and a secondary recovery submodule 936.

The read calling submodule 912 may be configured to send a read operation call to a storage device of the storage node as described above with reference to FIG. 5.

The block flagging submodule 914 may be configured to flag one or more logical blocks as undergoing recovery with reference to FIG. 5.

The log retrieving submodule 916 may be configured to retrieve a log page from the storage device as described above with reference to FIG. 5.

The read status returning submodule 918 may be configured to return a read status to the computing node as described above with reference to FIG. 7.

The recovery status returning submodule 920 may be configured to return a recovery status to the computing node as described above with reference to FIG. 7.

The acknowledgement returning submodule 922 may be configured to return an acknowledgement to the storage engine in response to the read operation call as described above with reference to FIG. 5.

The AER returning submodule 924 may be configured to return an AER indicating a second recovery function result to the storage engine as described above with reference to FIG. 5.

The read calling submodule 926 may be configured to send a read operation call to a cell array of the storage device as described above with reference to FIG. 6.

The voltage trimming submodule 928 may be configured to trim a reference voltage of a cell array as described above with reference to FIG. 6.

The status recording submodule 930 may be configured to record status acknowledgement as described above with reference to FIG. 6.

The log recording submodule 932 may be configured to record one or more read chunks in a log page as described above with reference to FIG. 6.

The primary recovery submodule 934 may be configured to perform a first recovery function and perform a second recovery function as described above with reference to FIG. 5.

The secondary recovery submodule 936 may be configured to perform a third recovery function as described above with reference to FIG. 6.

The system 900 may additionally include an input/output (I/O) interface 940 and a communication module 950 allowing the system 900 to communicate with other systems and devices over a network, such as the cloud network as described above with reference to FIG. 1. The network may include the Internet, wired media such as a wired network or direct-wired connections, and wireless media such as acoustic, radio frequency ("RF"), infrared, and other wireless media.

Some or all operations of the methods described above can be performed by execution of computer-readable instructions stored on a computer-readable storage medium, as defined below. The term "computer-readable instructions" as used in the description and claims, include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory (such as random-access memory ("RAM")) and/or non-volatile memory (such as read-only memory ("ROM"), flash memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transient computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory ("PRAM"), static random-access memory ("SRAM"), dynamic random-access memory ("DRAM"), other types of random-access memory ("RAM"), read-only memory ("ROM"), electrically erasable programmable read-only memory ("EEPROM"), flash memory or other memory technology, compact disk read-only memory ("CD-ROM"), digital versatile disks ("DVD") or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media that, when executed by one or more processors, may perform operations described above with reference to FIGS. 1-8. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Figure 10:
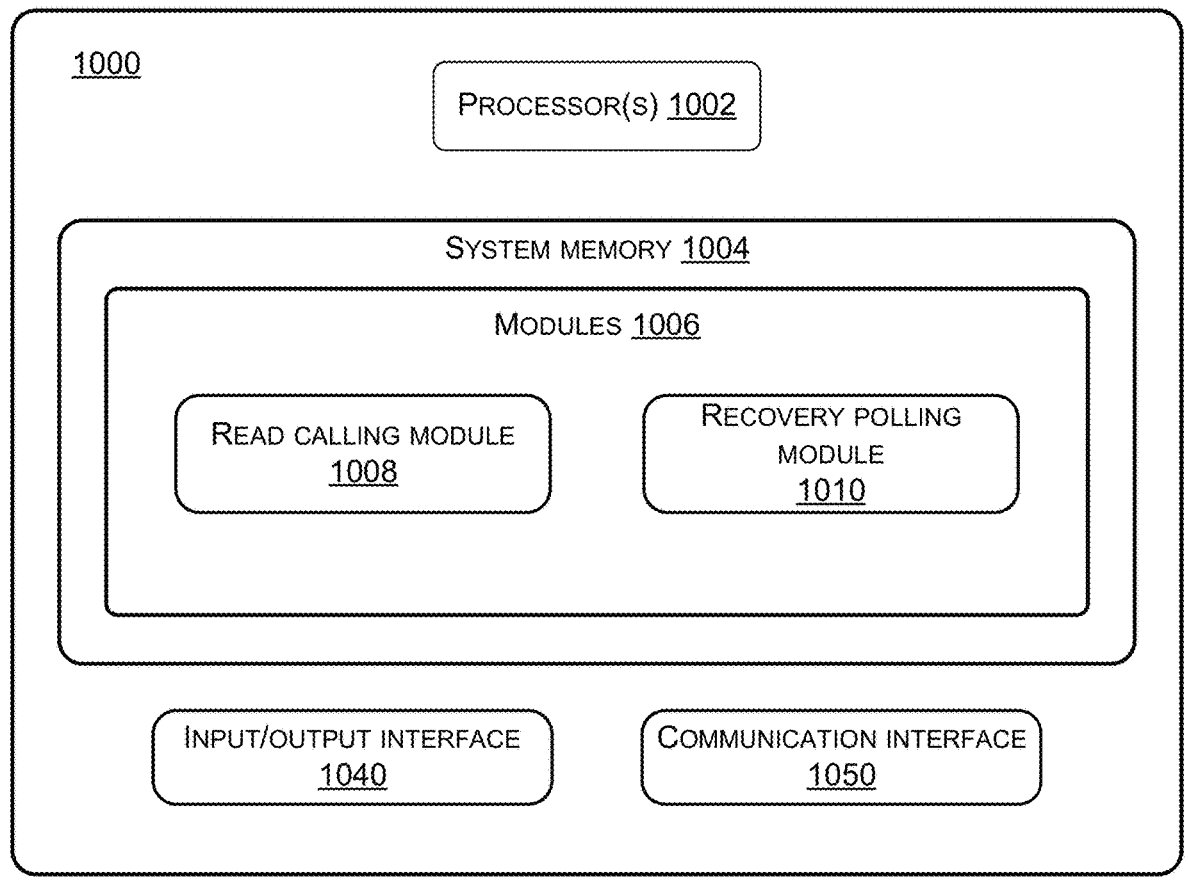
FIG. 10 illustrates an example computing node system for implementing the processes and methods described herein.

FIG. 10 illustrates an example computing node system 1000 for implementing the processes and methods described herein.

The techniques and mechanisms described herein may be implemented by multiple instances of the system 1000, as well as by any other computing device, system, and/or environment. The system 1000 may be a single computing system or an edge host providing physical or virtual computing resources as known by persons skilled in the art. Examples thereof include at least one node of a DFS node cluster as described herein. The system 1000 shown in FIG. 10 is only one example of a system and is not intended to suggest any limitation as to the scope of use or functionality of any computing device utilized to perform the processes and/or procedures described above. Other well-known computing devices, systems, environments and/or configurations that may be suitable for use with the embodiments include, but are not limited to, personal computers, server computers, hand-held or laptop devices, multiprocessor systems, microprocessor-based systems, set top boxes, game consoles, programmable consumer electronics, network PCs, minicomputers, mainframe computers, distributed computing environments that include any of the above systems or devices, implementations using field programmable gate arrays ("FPGAs") and application specific integrated circuits ("ASICs"), and/or the like.

The system 1000 may include one or more processors 1002 and system memory 1004 communicatively coupled to the processor(s) 1002. The processor(s) 1002 and system memory 1004 may be physical or may be virtualized and/or distributed. The processor(s) 1002 may execute one or more modules and/or processes to cause the processor(s) 1002 to perform a variety of functions. In embodiments, the processor(s) 1002 may include a central processing unit ("CPU"), a graphics processing unit ("GPU"), both CPU and GPU, or other processing units or components known in the art. Additionally, each of the processor(s) 1002 may possess its own local memory, which also may store program modules, program data, and/or one or more operating systems.

Depending on the exact configuration and type of the system 1000, the system memory 1004 may be volatile, such as RAM, non-volatile, such as ROM, flash memory, miniature hard drive, memory card, and the like, or some combination thereof. The system memory 1004 may include one or more computer-executable modules 1006 that are executable by the processor(s) 1002.

The modules 1006 may include, but are not limited to, a read calling module 1008 and a recovery polling module 1010.

The read calling module 1008 may be configured to send a read operation call to a storage engine hosted on a storage node as described above with reference to FIG. 7.

The recovery polling module 1010 may be configured to poll recovery status of a storage node as described above with reference to FIG. 7.

The system 1000 may additionally include an input/output (I/O) interface 1040 and a communication module 1050 allowing the system 1000 to communicate with other systems and devices over a network, such as the cloud network as described above with reference to FIG. 1. The network may include the Internet, wired media such as a wired network or direct-wired connections, and wireless media such as acoustic, radio frequency ("RF"), infrared, and other wireless media.

Some or all operations of the methods described above can be performed by execution of computer-readable instructions stored on a computer-readable storage medium, as defined below. The term "computer-readable instructions" as used in the description and claims, include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory (such as random-access memory ("RAM")) and/or non-volatile memory (such as read-only memory ("ROM"), flash memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transient computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory ("PRAM"), static random-access memory ("SRAM"), dynamic random-access memory ("DRAM"), other types of random-access memory ("RAM"), read-only memory ("ROM"), electrically erasable programmable read-only memory ("EEPROM"), flash memory or other memory technology, compact disk read-only memory ("CD-ROM"), digital versatile disks ("DVD") or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media that, when executed by one or more processors, may perform operations described above with reference to FIGS. 1-8. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

By the abovementioned technical solutions, the present disclosure provides a data recovery bypassing protocol, by which a storage node of a cloud network may return a replica of lost data being recovered to timely service a read operation call from a computing node of the cloud network, without waiting for completion of a first, a second, and a third recovery function. Storage devices implement asynchronous event reporting ("AER") protocol between a storage engine hosted on a storage node and storage devices of the storage node. Within a storage device, an AER generation protocol is implemented enabling a storage controller of the storage device and a flash memory cell array of the storage device to intercommunicate, and enabling the storage controller to generate AER messages. By bypassing secondary recovery, the computing node may successfully read lost data from many or all storage nodes of the cloud network. Consequently, as long as the lost data may be read from any other storage node, or may be reconstructed without resorting to a second recovery function or a third recovery function from any other storage node, the computing node may complete the read operation call without suffering milliseconds or tens of milliseconds in performance loss and blocking, averting observable degradation of QoS of the overall computing system.

Example Clauses

A. A method comprising: sending, by a storage engine hosted on a storage node of a cloud network, a read operation call to a storage device of the storage node; performing, by a storage controller of the storage device, at least one of a first recovery function and a second recovery function returning a failure; beginning, by the storage controller of the storage device, a third recovery function across the storage node; and returning, by the storage engine, a read status to a computing node of the cloud network during the third recovery function.

B. The method as paragraph A recites, further comprising flagging, by the storage engine, a recovery status of a logical block of the storage device as undergoing recovery; retrieving, by the storage engine, a log page from the storage device; and unflagging, by the storage engine, the recovery status based on the log page.

C. The method as paragraph A recites, further comprising returning, by the storage engine, the recovery status to the computing node in response to recovery status polling by the computing node.

D. The method as paragraph A recites, wherein the storage controller performs the first recovery function upon the logical block based on applying one voltage reference ("VREF") to the storage device, and further comprising returning, by the storage controller, a bad status acknowledgement to the storage engine, causing the storage engine to flag a recovery status of a logical block of the storage device as undergoing recovery.

E. The method as paragraph D recites, further comprising performing, by the storage controller, the second recovery function upon the logical block based on applying a plurality of VREFs to the storage device; and performing, by the storage controller, the third recovery function.

F. The method as paragraph E recites, further comprising unflagging, by the storage engine, the recovery status after the storage controller performs the second recovery function or after the storage controller performs the third recovery function.

G. The method as paragraph A recites, further comprising returning, by the storage engine, a recovery status to the computing node in response to recovery status polling.

H. A system of a cloud network, comprising: one or more processors; and memory communicatively coupled to the one or more processors, the memory storing computer-executable modules executable by the one or more processors that, when executed by the one or more processors, perform associated operations, the computer-executable modules comprising a storage engine module and a storage controller module, the storage engine module further comprising: a read calling submodule configured to send a read operation call to a storage device of the system and a read status returning submodule configured to return a read status to a computing node of the cloud network based on the recovery status; and the storage controller module further comprising a primary recovery submodule configured to perform at least one of a first recovery function and a second recovery function returning a failure; and a secondary recovery submodule configured to begin a third recovery function across the system.

I. The system as paragraph H recites, wherein the storage engine module further comprises a block flagging submodule configured to flag a recovery status of a logical block of the storage device as undergoing recovery; and a log retrieving submodule configured to retrieve a log page from the storage device; and the block flagging submodule is further configured to unflag the recovery status based on the log page.

J. The system as paragraph H recites, wherein the storage engine module further comprises a recovery status returning submodule configured to return the recovery status to the computing node in response to recovery status polling by the computing node.

K. The system as paragraph H recites, wherein the storage engine module further comprises a block flagging submodule configured to flag a recovery status of a logical block of the storage device as undergoing recovery, wherein the primary recovery submodule is configured to perform the first recovery function upon the logical block based on applying one reference voltage ("VREF") to the storage device, and the storage controller module further comprises an acknowledgment returning submodule configured to return a bad status acknowledgement to the storage engine module, causing the block flagging submodule to flag the recovery status of the logical block.

L. The system as paragraph K recites, wherein the primary recovery submodule is further configured to perform the second recovery function upon the logical block based on applying a plurality of VREFs to the storage device; and wherein the storage controller module further comprises a secondary recovery submodule configured to perform the third recovery function.

M. The system as paragraph L recites, wherein the block flagging submodule is further configured to unflag the recovery status after the primary recovery submodule performs the second recovery function or after the secondary recovery submodule performs the third recovery function.

N. The system as paragraph H recites, wherein the storage engine module further comprises a recovery status returning submodule configured to return a recovery status to the computing node in response to recovery status polling.

O. A computer-readable storage medium storing computer-readable instructions executable by one or more processors, that when executed by the one or more processors, cause the one or more processors to perform operations comprising: sending, by a storage engine hosted on a storage node of a cloud network, a read operation call to a storage device of the storage node; performing, by a storage controller of the storage device, at least one of a first recovery function and a second recovery function returning a failure; beginning, by the storage controller of the storage device, a third recovery function across the storage node; and returning, by the storage engine, a read status to a computing node of the cloud network during the third recovery function.

P. The computer-readable storage medium as paragraph O recites, the operations further comprising flagging, by the storage engine, a recovery status of a logical block of the storage device as undergoing recovery; retrieving, by the storage engine, a log page from the storage device; and unflagging, by the storage engine, the recovery status based on the log page.

Q. The computer-readable storage medium as paragraph O recites, the operations further comprising returning, by the storage engine, the recovery status to the computing node in response to recovery status polling by the computing node.

R. The computer-readable storage medium as paragraph O recites, wherein the storage controller performs the first recovery function upon the logical block based on applying one reference voltage ("VREF") to the storage device, and the operations further comprise returning, by the storage controller, a bad status acknowledgement to the storage engine, causing the storage engine to flag a recovery status of a logical block of the storage device as undergoing recovery.

S. The computer-readable storage medium as paragraph R recites, the operations further comprising performing, by the storage controller, the second recovery function upon the logical block based on applying a plurality of VREFs to the storage device; and performing, by the storage controller, the third recovery function.

T. The computer-readable storage medium as paragraph S recites, the operations further comprising unflagging, by the storage engine, the recovery status after the storage controller performs the second recovery function or after the storage controller performs the third recovery function.

U. The computer-readable storage medium as paragraph O recites, the operations further comprising returning, by the storage engine, a recovery status to the computing node in response to recovery status polling.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method comprising:
    sending, by a storage engine hosted on a storage node of a cloud network, a read operation call to a storage device of the storage node;
    performing, by a storage controller of the storage device, at least one of a first recovery function and a second recovery function returning a failure;
    beginning, by the storage controller of the storage device, a third recovery function across the storage node;
    returning, by the storage engine, a read status to a computing node of the cloud network while recovery of one or more chunks to be read by the read operation call is ongoing; and
    returning, by the storage engine, a recovery status to the computing node in response to recovery status polling.

2. The method of claim 1, further comprising:
    flagging, by the storage engine, a recovery status of a logical block of the storage device as undergoing recovery;
    retrieving, by the storage engine, a log page from the storage device; and
    unflagging, by the storage engine, the recovery status of the logical block based on the log page.

3. The method of claim 2, further comprising returning, by the storage engine, the recovery status of the logical block to the computing node in response to recovery status polling by the computing node.

4. The method of claim 1, wherein the storage controller performs the first recovery function upon the logical block based on applying one voltage reference ("VREF") to the storage device, and further comprising returning, by the storage controller, a bad status acknowledgement to the storage engine, causing the storage engine to flag a recovery status of a logical block as undergoing recovery.

5. The method of claim 4, further comprising performing, by the storage controller, the second recovery function upon the logical block based on applying a plurality of VREFs to the storage device; and performing, by the storage controller, the third recovery function.

6. The method of claim 5, further comprising unflagging, by the storage engine, the recovery status after the storage controller performs the second recovery function or after the storage controller performs the third recovery function.

7. A system of a cloud network, comprising:
    one or more processors; and
    memory communicatively coupled to the one or more processors, the memory storing computer-executable modules executable by the one or more processors that, when executed by the one or more processors, perform associated operations, the computer-executable modules comprising a storage engine module and a storage controller module, the storage engine module further comprising:
a read calling submodule configured to send a read operation call to a storage device of the system; and
a read status returning submodule configured to return a read status to a computing node of the cloud network while recovery of one or more chunks to be read by the read operation call is ongoing, and
the storage controller module further comprising:
a primary recovery submodule configured to perform at least one of a first recovery function and a second recovery function returning a failure;
a secondary recovery submodule configured to begin a third recovery function across the system; and
a recovery status returning submodule configured to return a recovery status to the computing node in response to recovery status polling.

8. The system of claim 7, wherein the storage engine module further comprises:
a block flagging submodule configured to flag a recovery status of a logical block of the storage device as undergoing recovery; and
a log retrieving submodule configured to retrieve a log page from the storage device;
and the block flagging submodule is further configured to unflag the recovery status of the logical block based on the log page.

9. The system of claim 8, wherein the recovery status returning submodule is further configured to return the recovery status of the logical block to the computing node in response to recovery status polling by the computing node.

10. The system of claim 7, wherein the storage engine module further comprises a block flagging submodule configured to flag a recovery status of a logical block of the storage device as undergoing recovery,
wherein the primary recovery submodule is configured to perform the first recovery function upon the logical block based on applying one reference voltage ("VREF") to the storage device, and
the storage controller module further comprises:
an acknowledgment returning submodule configured to return a bad status acknowledgement to the storage engine module, causing the block flagging submodule to flag the recovery status of the logical block.

11. The system of claim 10, wherein the primary recovery submodule is further configured to perform the second recovery function upon the logical block based on applying a plurality of VREFs to the storage device; and wherein the storage controller module further comprises a secondary recovery submodule configured to perform the third recovery function.

12. The system of claim 11, wherein the block flagging submodule is further configured to unflag the recovery status after the primary recovery submodule performs the second recovery function or after the secondary recovery submodule performs the third recovery function.

13. A non-transitory computer-readable storage medium storing computer-readable instructions executable by one or more processors, that when executed by the one or more processors, cause the one or more processors to perform operations comprising:
sending, by a storage engine hosted on a storage node of a cloud network, a read operation call to a storage device of the storage node;
performing, by a storage controller of the storage device, at least one of a first recovery function and a second recovery function returning a failure;
beginning, by the storage controller of the storage device, a third recovery function across the storage node;
returning, by the storage engine, a read status to a computing node of the cloud network while recovery of one or more chunks to be read by the read operation call is ongoing; and
returning, by the storage engine, a recovery status to the computing node in response to recovery status polling.

14. The non-transitory computer-readable storage medium of claim 13, the operations further comprising:
flagging, by the storage engine, a recovery status of a logical block of the storage device as undergoing recovery;
retrieving, by the storage engine, a log page from the storage device; and
unflagging, by the storage engine, the recovery status of the logical block based on the log page.

15. The non-transitory computer-readable storage medium of claim 14, the operations further comprising returning, by the storage engine, the recovery status of the logical block to the computing node in response to recovery status polling by the computing node.

16. The non-transitory computer-readable storage medium of claim 13, wherein the storage controller performs the first recovery function upon the logical block based on applying one reference voltage ("VREF") to the storage device, and the operations further comprising returning, by the storage controller, a bad status acknowledgement to the storage engine, causing the storage engine to flag a recovery status of a logical block of the storage device as undergoing recovery.

17. The non-transitory computer-readable storage medium of claim 16, the operations further comprising performing, by the storage controller, the second recovery function upon the logical block; and performing, by the storage controller, the third recovery function.

* * * * *